United States Patent
Li et al.

(10) Patent No.: US 7,453,322 B2
(45) Date of Patent: Nov. 18, 2008

(54) TRANSIMPEDANCE AMPLIFIER USING NEGATIVE IMPEDANCE COMPENSATION

(75) Inventors: Day-Uei Li, Hsinchu (TW); Chia-Ming Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 119 days.

(21) Appl. No.: 11/369,286

(22) Filed: Mar. 6, 2006

(65) Prior Publication Data

US 2007/0152756 A1 Jul. 5, 2007

(30) Foreign Application Priority Data

Dec. 30, 2005 (TW) .............................. 94147571 A

(51) Int. Cl.
*H03F 3/08* (2006.01)
(52) U.S. Cl. ..................................... 330/308
(58) Field of Classification Search ................. 330/59, 330/308; 250/214 A, 214 AG
See application file for complete search history.

(56) References Cited

U.S. PATENT DOCUMENTS

| 4,855,687 A | * | 8/1989 | Hebert ........................ 330/308 |
| 7,002,409 B1 | | 2/2006 | Aram .......................... 330/98 |
| 2003/0218508 A1 | | 11/2003 | Chiou et al. ................. 330/308 |
| 2006/0045531 A1 | | 3/2006 | Killmeyer et al. ........... 398/135 |

* cited by examiner

*Primary Examiner*—Khanh V Nguyen

(57) ABSTRACT

A transimpedance amplifier (TIA) with negative impedance compensation comprises a TIA element and a negative impedance compensator connected to the output terminal of the TIA element. The major components of the negative impedance compensator are a negative impedance element formed by a positive feedback circuit, and a compensation circuit for the parasitic capacitance at the output terminal. The negative impedance compensator changes the equivalent impedance of the output terminal from low to high with respect to the ground, and compensates the parasitic capacitance at the output terminal. Thus, an increase of both bandwidth and voltage gain is achieved.

12 Claims, 11 Drawing Sheets

TRANSIMPEDANCE AMPLIFIER USING NEGATIVE IMPEDANCE COMPENSATION

FIELD OF THE INVENTION

The present invention generally relates to an amplifier for an optical communication system, especially to a transimpedance amplifier (TIA) with negative impedance compensation.

BACKGROUND OF THE INVENTION

The gain and the sensitivity of an optical receiver in an optical communication system are very important characteristics, for the optimization of the transmission performance depends on a simultaneous increase of these two characteristics. A conventional single-stage TIA, as shown in FIG. 1, contains a simple circuit structure 100 and has good stability. Its major components include a photodiode 101 and a basic operational amplifier 102. The overall gain and the bandwidth of an amplifier are heavily dependent on the output impedance of the amplifier. Therefore, this kind of single-stage TIAs has neither a high feed-back resistance $R_F$ nor a high sensitivity due to its low voltage gain.

Generally speaking, a multi-stage TIA 200 shown in FIG. 2 can be adopted to increase the voltage gain. This kind of multi-stage TIAs comprises multiple cascaded single-stage amplifiers 201-203 to achieve a high feed-back impedance $R_F$, and a high sensitivity. Though a high voltage gain is obtained on this multi-stage structure, the phase margin is hard to control. Especially for applications with a high dynamic range, the stability of automatic gain control (AGC) is questionable. Moreover, the large power consumption resulted from the multi-stage structure will greatly increase the difficulty in designing a high-bandwidth system.

If the equivalent output impedance of a TIA with respect to the ground is increased, its voltage gain can be greatly enhanced. Then, the above problems related to the conventional TIAs will likely be resolved.

SUMMARY OF THE INVENTION

In the present invention, a TIA using negative impedance compensation is provided to overcome the drawbacks of the aforementioned conventional TIAs. The present invention adds a negative impedance provided by a positive feedback circuit (voltage gain>1) to change the output impedance. Besides, a negative capacitance is added to compensate the parasitic capacitance at the output terminal of the feedback circuit. Thus, an increase of both bandwidth and voltage gain is achieved.

In the first embodiment of the present invention, a TIA mainly comprises a TIA element and a negative impedance compensator. The negative impedance compensator is connected to the output terminal of the single-stage TIA. Thus, the output impedance of the single-stage TIA with respect to the ground is increased and the parasitic capacitance at the output terminal is compensated.

There are various designs capable of implementing the negative impedance compensator. The major components of the negative impedance compensator are a negative impedance element formed by a positive feedback circuit, and a compensation circuit for the parasitic capacitance at the output terminal. The compensation circuit can be formed by resistors or capacitors.

In the $2^{nd}$ embodiment of the present invention a TIA mainly comprises a differential TIA and a negative impedance compensator. The differential TIA consists of two single-stage TIAs to form a differential circuit topology. And the negative impedance compensator can be implemented with the same designs described in the first embodiment.

In a simulation experiment, the bandwidth enhancement factor of the TIA having negative impedance compensation disclosed in the present invention is as high as 3, and the applicable dynamic range is as large as 30 dBm.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
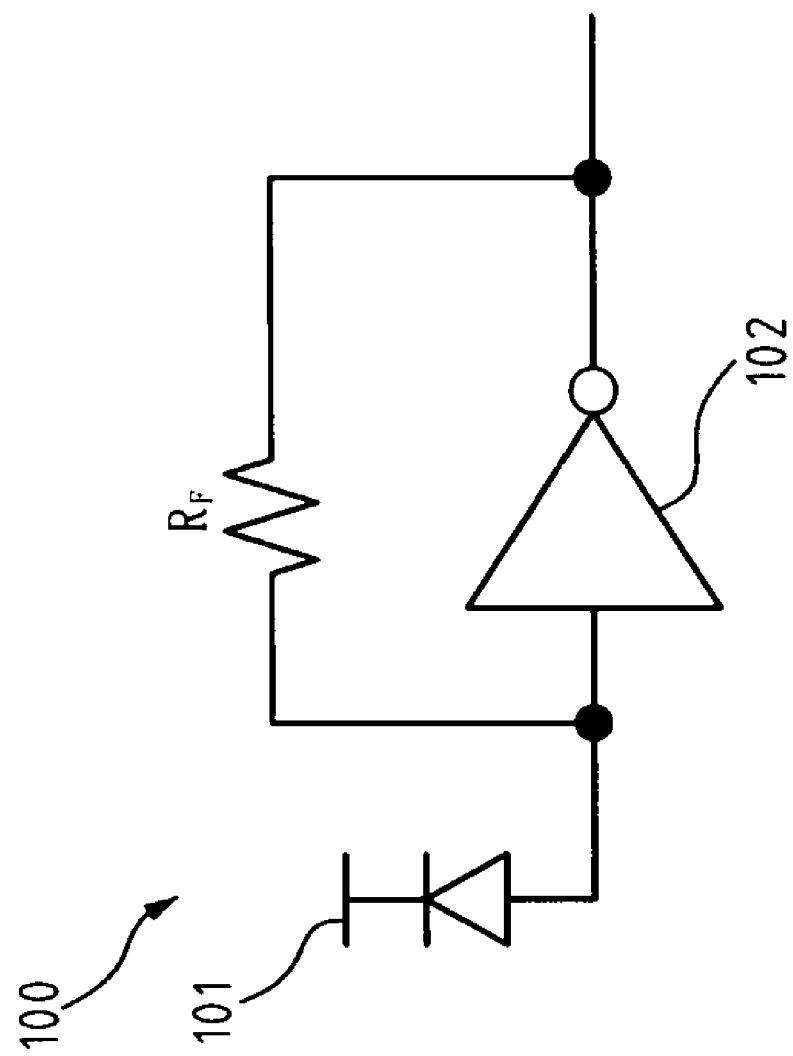
FIG. 1 shows the topology of a conventional single-stage transimpedance amplifier.
Figure 2:
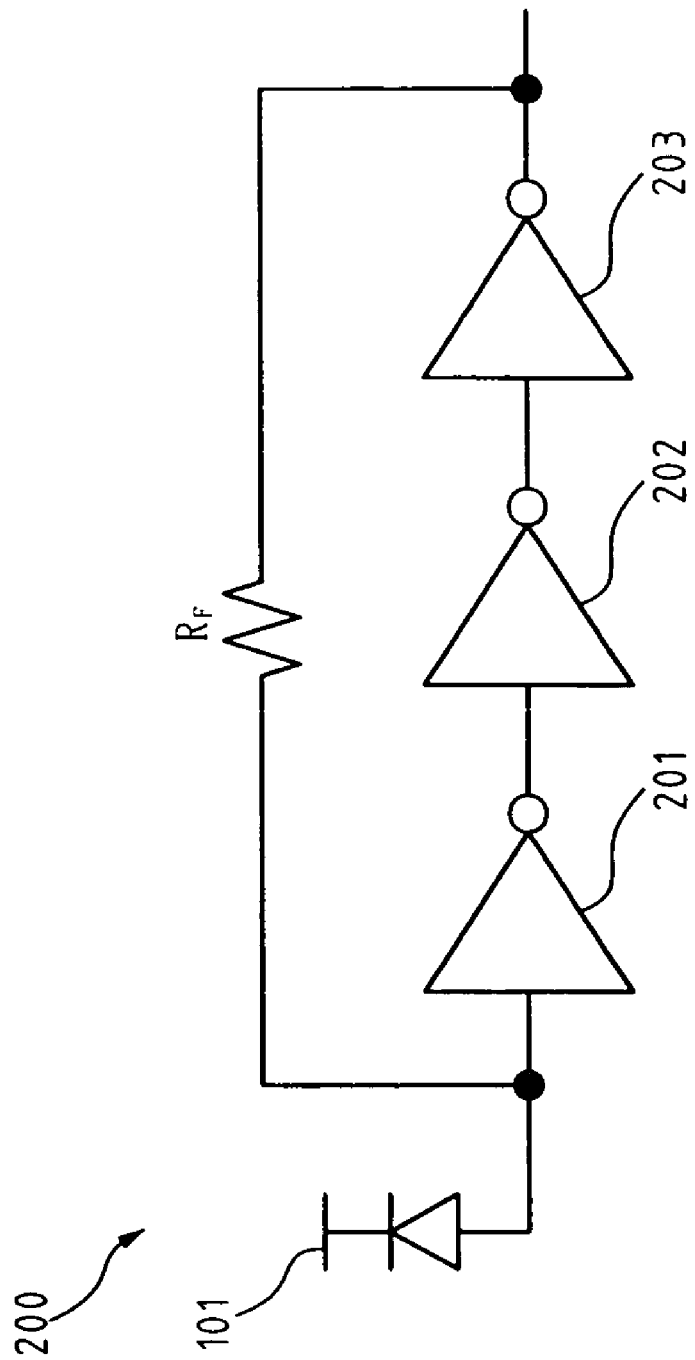
FIG. 2 shows the topology of a conventional multi-stage transimpedance amplifier.
Figure 3:
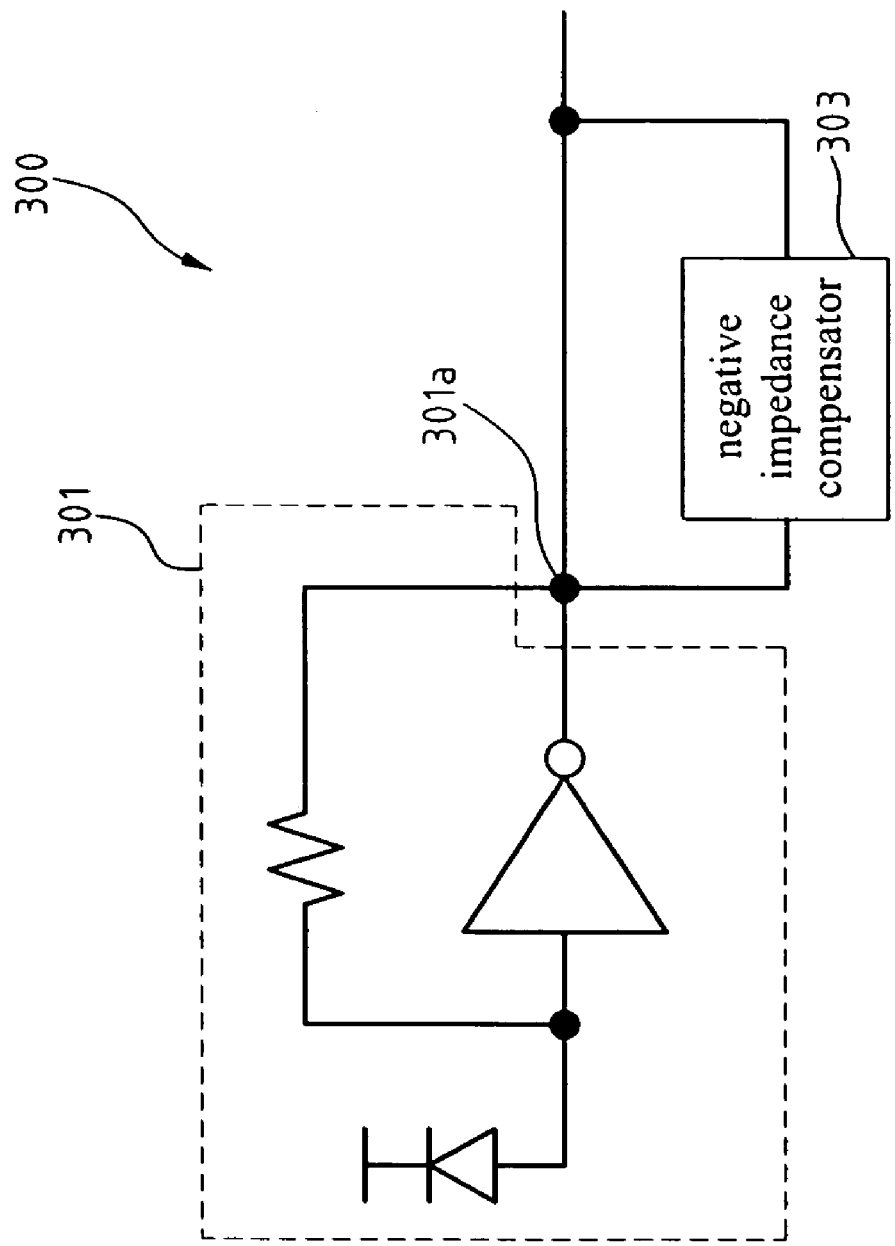
FIG. 3 is a block diagram showing the topology of the first embodiment of the present invention.

FIG. 3 is a block diagram showing the topology of the first embodiment of the present invention. Referring to FIG. 3, The TIA 300 mainly comprises a TIA element 301 and a negative impedance compensator 303. Without loss of generality, the TIA element 301 is illustrated by a single-stage TIA 301. In other words, this topology is pretty simple and the present invention may also only use a single-stage TIA and a negative impedance compensation circuit to obtain a high bandwidth and wide dynamic range TIA. The single-stage TIA 301 has an output terminal 301a which has an equivalent impedance with respect to the ground. The negative impedance compensator 303 is connected to the output terminal 301a of the single-stage TIA 301. The resulting effects are to increase the equivalent output impedance at the output terminal 301a and to compensate the parasitic capacitance generated by the output terminal 301a.

There are various designs capable of implementing the negative impedance compensator 303. The major components of the negative impedance compensator are a negative impedance element formed by a positive feedback circuit, and a compensation circuit for the parasitic capacitance at the output terminal. The compensation circuit can be formed by resistors or capacitors. This is explained in the followings using the working examples shown in FIGS. 4-6.

Figure 4:
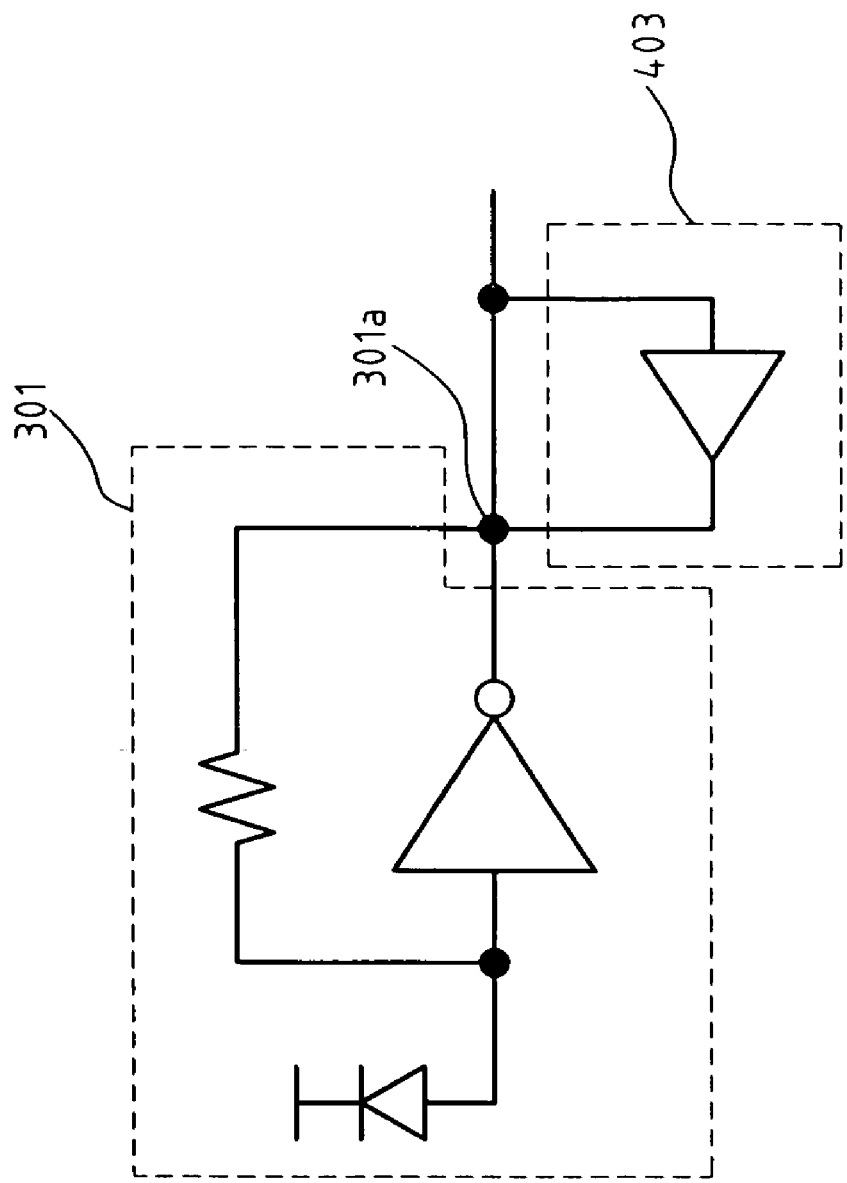
FIG. 4 shows a working example of the first embodiment of the present invention, wherein a negative impedance compensator is formed by a positive feedback circuit.
Figure 5:
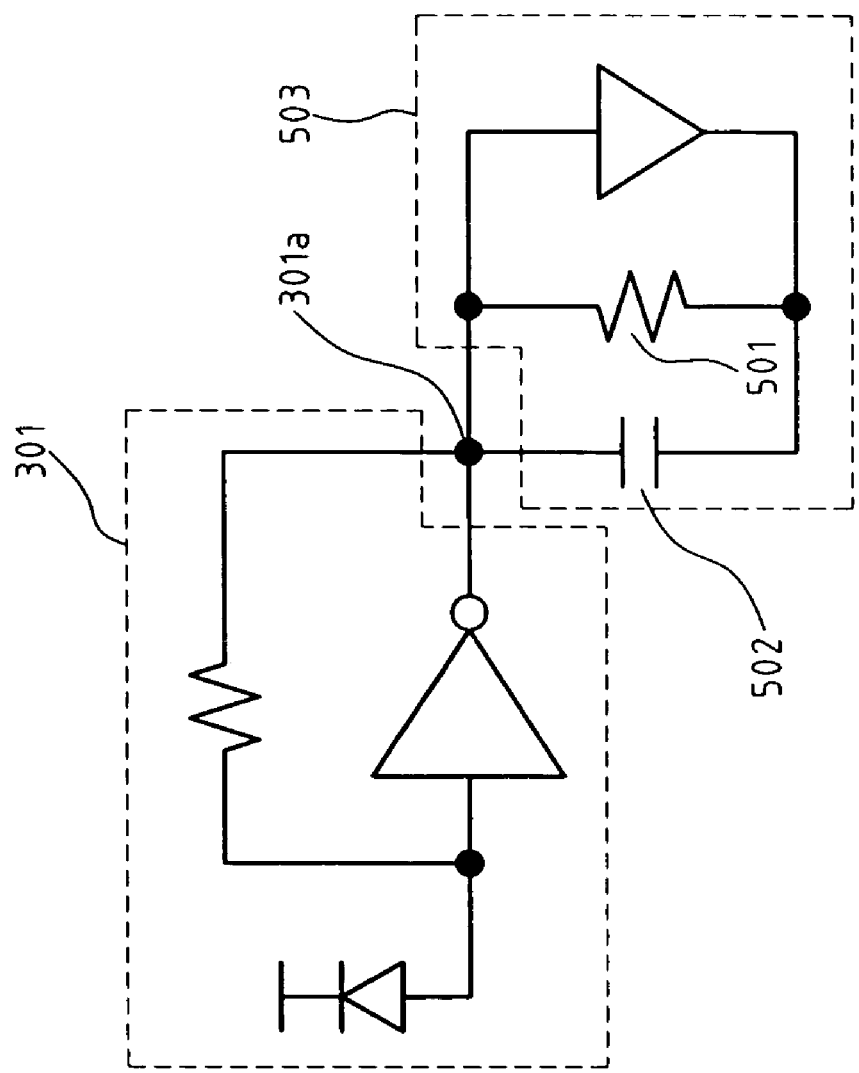
FIG. 5 shows a working example of the first embodiment of the present invention, wherein a negative impedance compensator contains a negative resistance element and a negative capacitance element.
Figure 6:
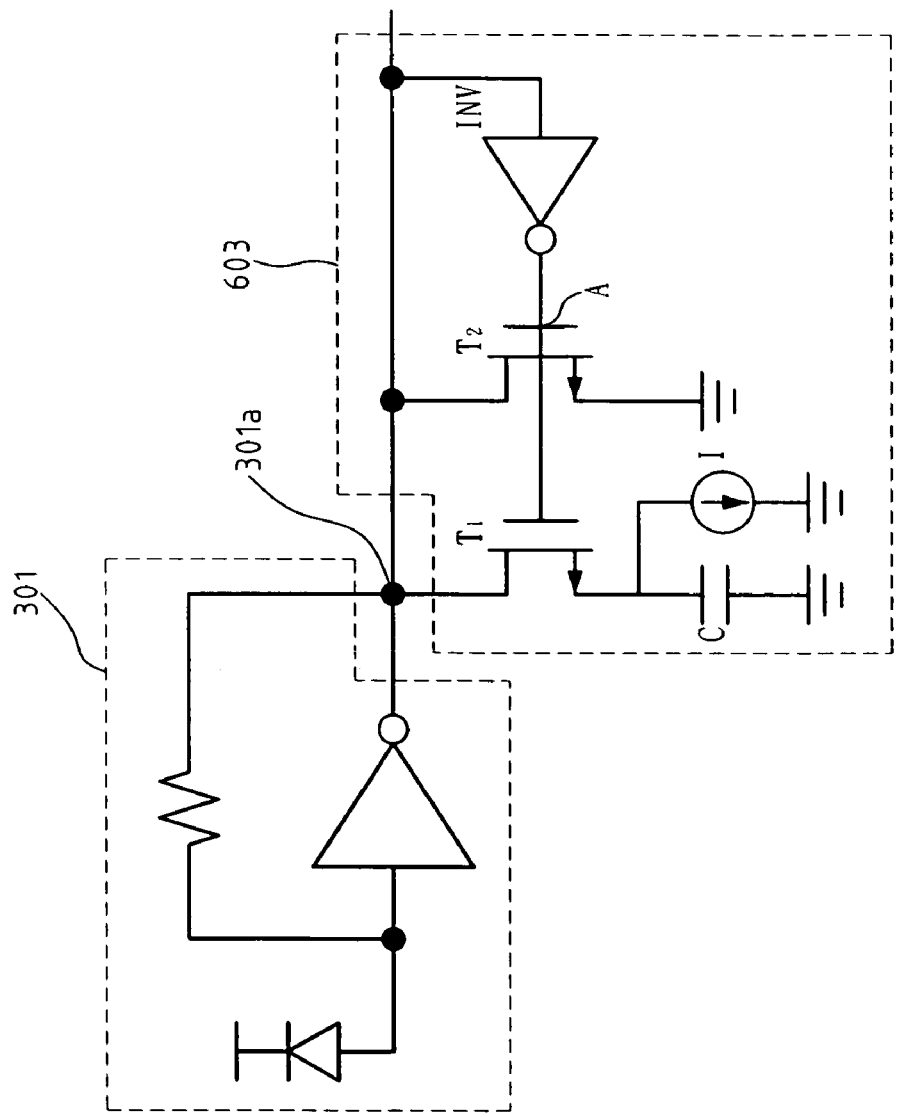
FIG. 6 shows a working example of the first embodiment of the present invention, wherein a negative impedance compensator contains different negative resistance elements and negative capacitance elements.

The TIA in the example shown in FIG. 4 comprises a single-stage TIA 301 as well as a negative impedance compensator 403. The negative impedance compensator 403 is formed by a positive feedback circuit which provides a negative resistance to change the equivalent impedance at the output terminal 301a with respect to the ground. The negative impedance compensator 503 in the example shown in FIG. 5 is different from that shown in FIG. 4. The difference is that a negative capacitor 502 is added to compensate the parasitic capacitance generated by the output terminal 301a. Therefore, the bandwidth limitation caused by parasitic capacitance is eliminated. In other words, the negative impedance compensator 503 in the example in FIG. 5 is formed by connecting a negative resistor 501 and a negative capacitor 502 in parallel In the example shown in FIG. 6, the negative impedance compensator 603 has a different configuration than that shown in FIG. 5. Referring to FIG. 6, the negative resistor is formed by a transistor $T_2$ and an inverter INV. And, the negative capacitor is formed by a transistor $T_1$, a current source 1, a capacitor C, and the inverter INV. The transistors $T_2$ and $T_1$ have a common gate A, and are connected in parallel.

Figure 7:
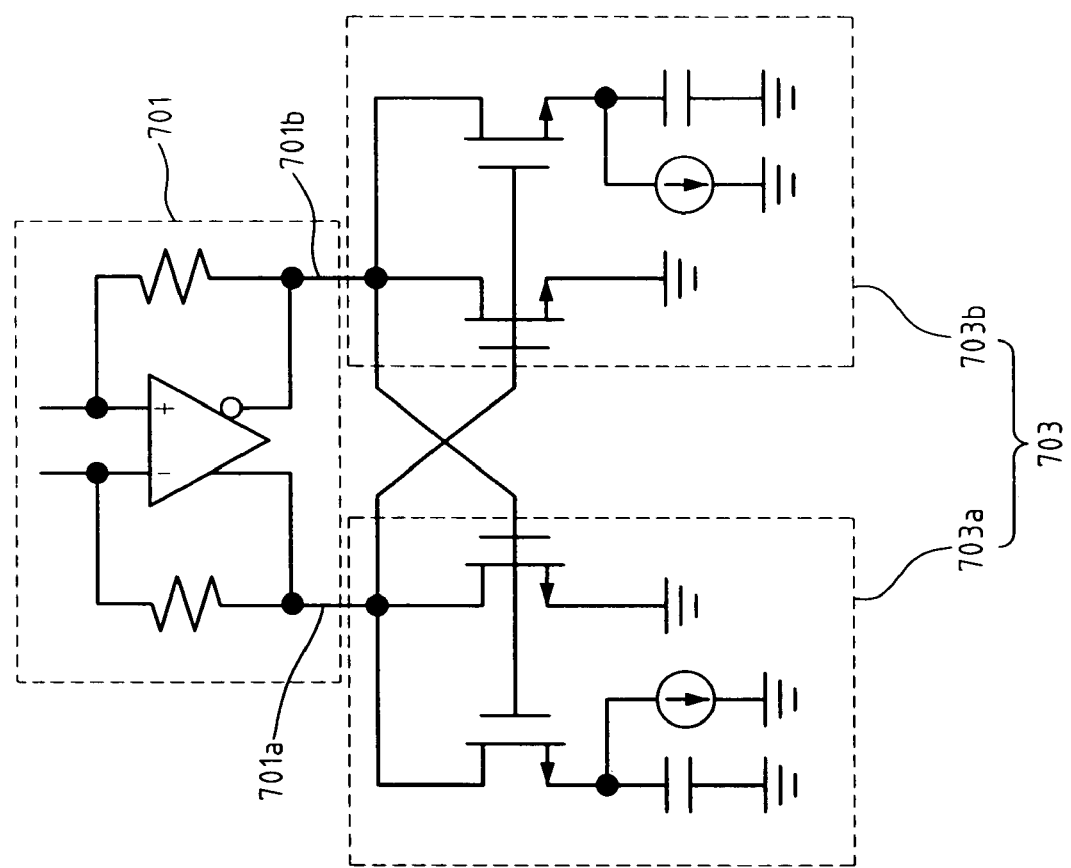
FIG. 7 is a block diagram showing the topology of the second embodiment of the present invention.

FIG. 7 is a block diagram showing the topology of the second embodiment of the present invention. Referring to FIG. 7, the TIA having negative impedance compensation mainly comprises a differential TIA 701 and a negative impedance compensator 703. The differential TIA 701 consists of two single-stage TIAs that are connected in parallel to form a differential circuit topology. The two output terminals 701a and 701b of the differential TIA 701 are connected to the negative impedance compensator 703. The negative impedance compensator 703 can be implemented with similar circuit topologies or their derived topologies used in the first embodiment of the present invention. In general, the negative impedance compensator 703 in FIG. 7 is constructed from two negative impedance compensators shown in FIG. 6. These two negative impedance compensators are connected in parallel to form a differential circuit topology, and are labeled as 703a and 703b in FIG. 7. A detailed description of the differential topology is made as follows in FIG. 8.

Figure 8:
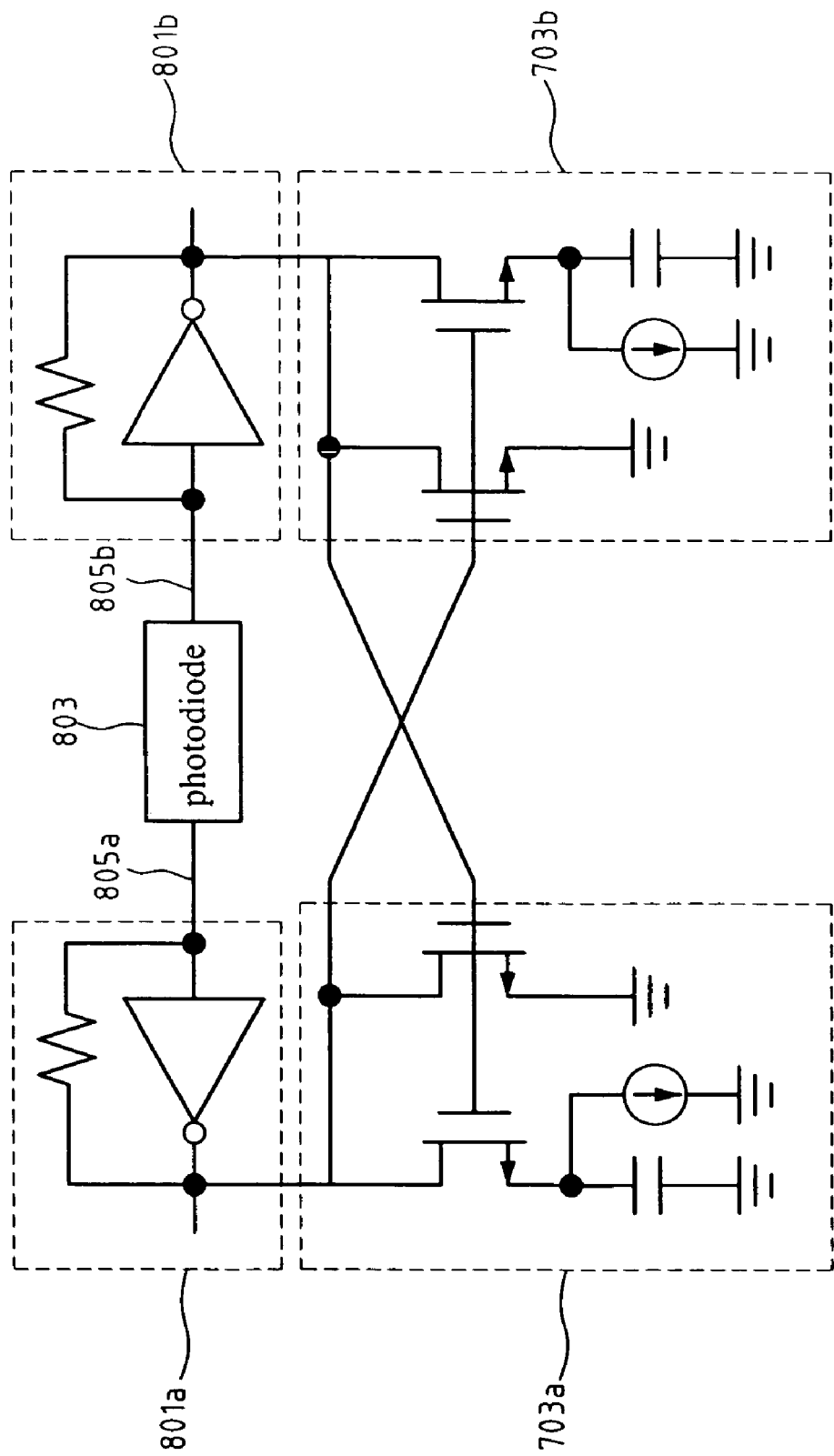
FIG. 8 describes in detail the topology of a differential TIA shown in FIG. 7.

Referring to FIG. 8, the differential TIA 701 in FIG. 7 consists of two single-stage TIAs shown in FIG. 8. These two single-stage TIAs are connected in parallel to form a differential circuit topology. The differential TIA 701 comprises a photodiode 803 and two single-stage TIAs 801a and 801b. In FIG. 8, the circuit structure of 801a and 703a is symmetrical to that of the other pair 801b and 703b. In other words, the two terminals 805a and 805b of the photodiode 803 are connected to the two symmetrical circuit structures, respectively.

Figure 9:
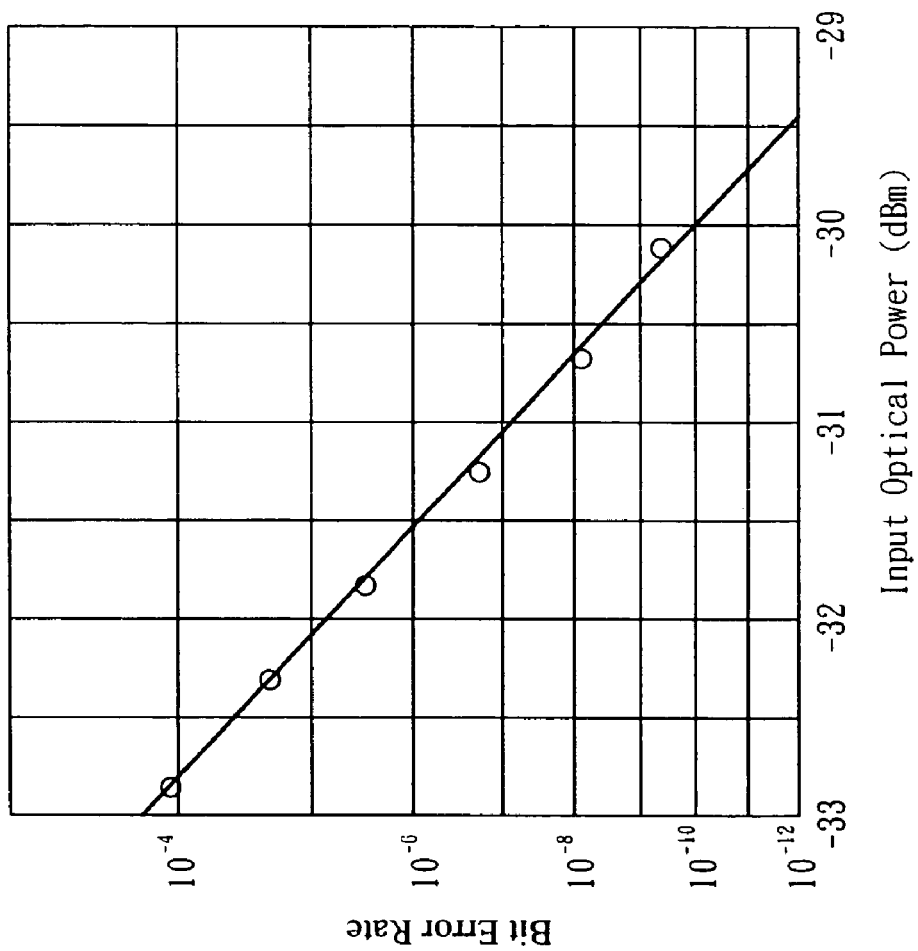
FIG. 9 shows the simulation results performed on a TIA of the present invention.

FIG. 9 shows the simulation results performed on a TIA of the present invention. Wherein, the TIA is similar to the one shown in FIG. 6, and has an operation voltage of 3V and a bandwidth of 1.25 GHz. The TIA was manufactured by a 0.35 μm CMOS process. In FIG. 9, the horizontal axis represents input optical power with a unit of dBm; and the vertical axis represents bit error rate (BER). As can be seen from this figure, the applicable dynamic range is as large as 30 dBm (from −29.5 dBm to 0 dBm). Besides, the bandwidth enhancement factor of the TIA is as high as 3.

Figure 10:
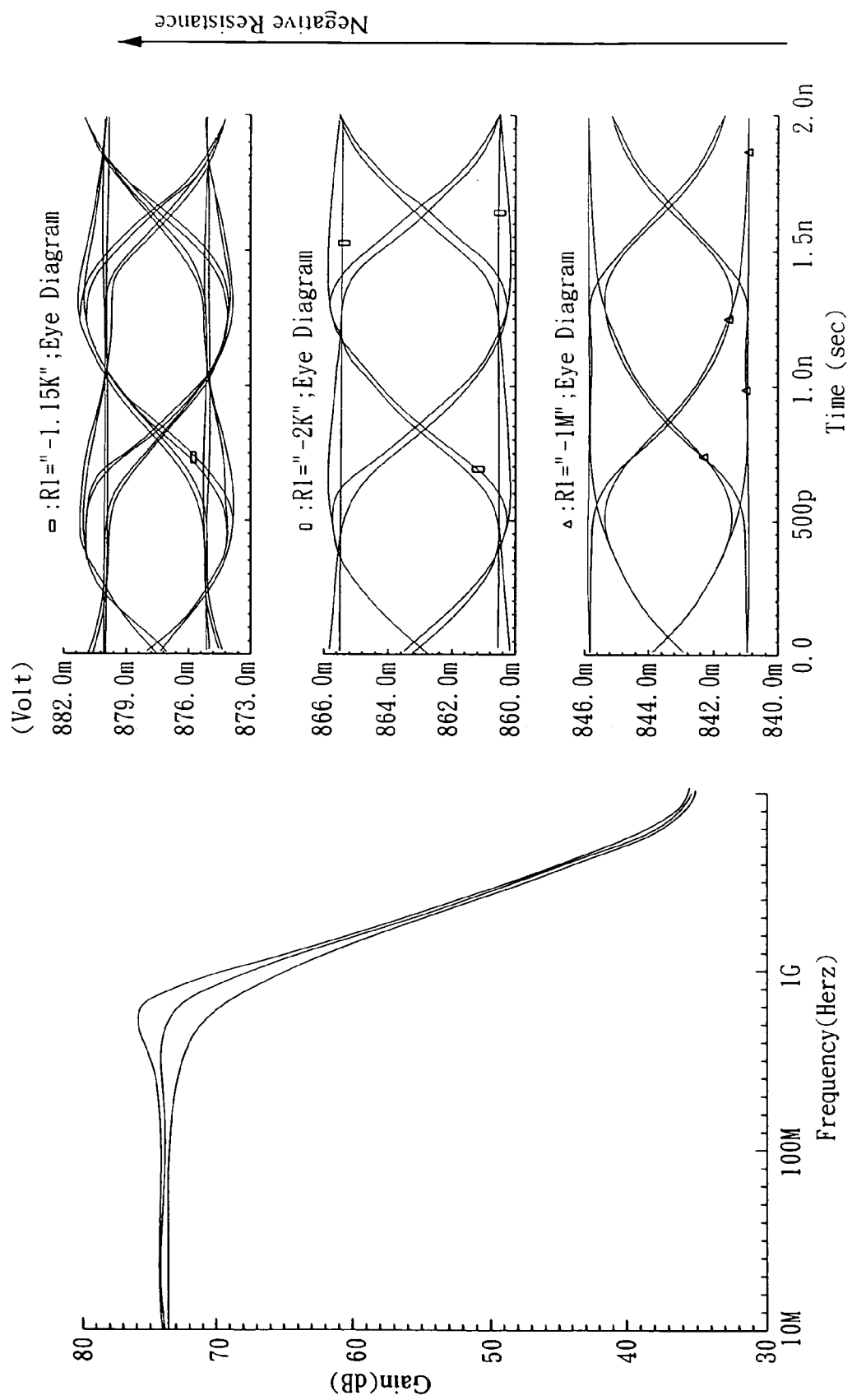
FIG. 10 shows the effects of negative resistance compensation according to the present invention.

FIG. 10 shows the effects of negative resistance compensation according to the present invention. In the left exhibit, the horizontal axis represents frequency and the vertical axis represents gain. In the right exhibit, the horizontal axis represents time and the vertical axis represents volt.

Figure 11:
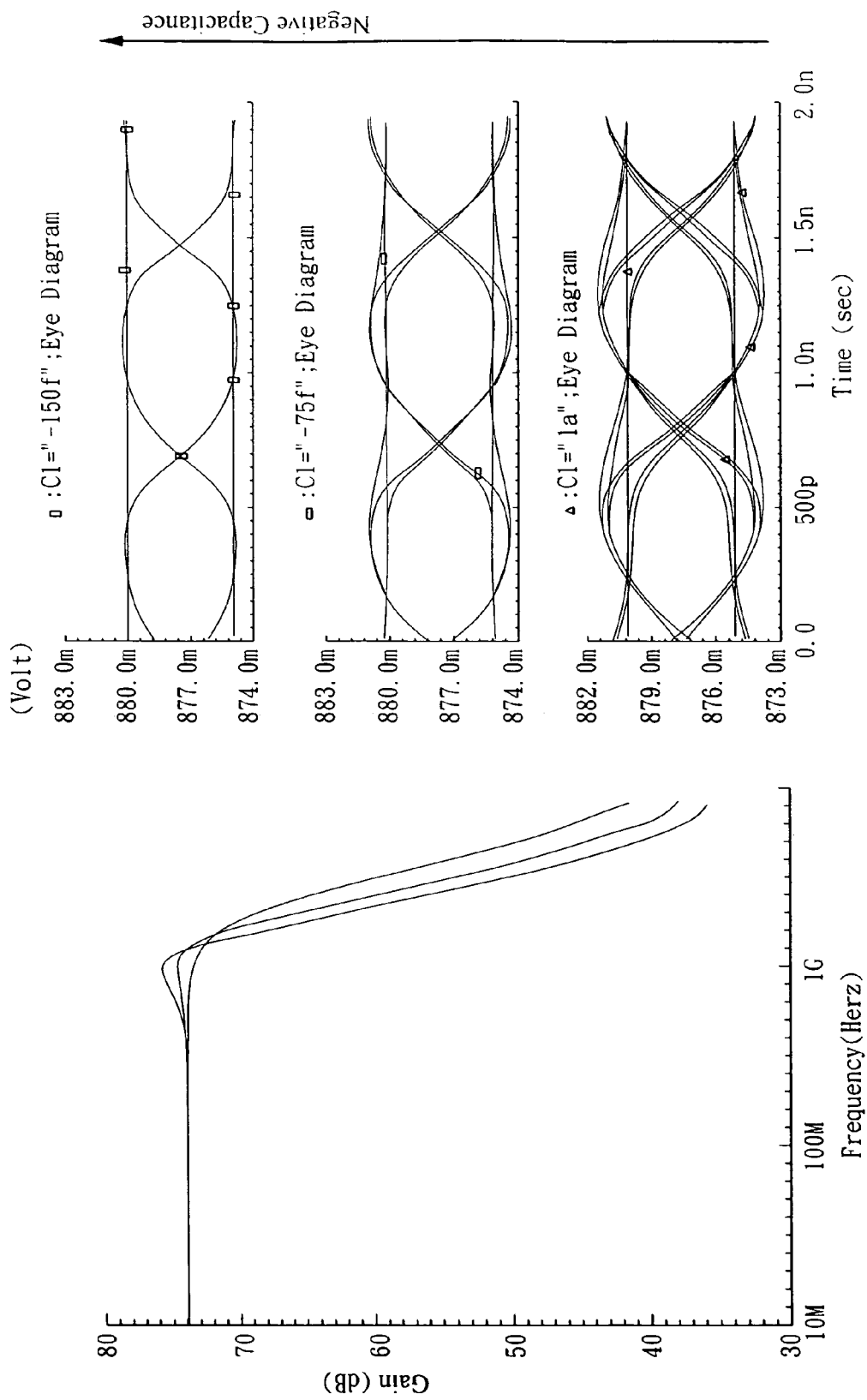
FIG. 11 shows the effects of negative capacitance compensation according to the present invention.

FIG. 11 shows the effects of negative capacitance compensation according to the present invention. In the left exhibit, the horizontal axis represents frequency and the vertical axis represents gain. In the right exhibit, the horizontal axis represents time and the vertical axis represents volt.

In summary, the TIA having negative impedance compensation comprises a single-stage or differential TIA and a negative impedance compensator. The negative impedance compensator is connected to the output terminal of the single-stage TIA. There are various designs capable of implementing the negative impedance compensator. The negative impedance compensator is connected to the output terminal of the single-stage TIA. Thus, the output impedance of the single-stage TIA with respect to the ground is increased and the parasitic capacitance at the output terminal is compensated. The bandwidth enhancement factor of the TIA of the present invention is as high as 3, and the applicable dynamic range is as large as 30 dBm.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A transimpedance amplifier having negative impedance compensation comprising:
    a transimpedance amplifier element having an output terminal, and said output terminal having an equivalent impedance with respect to a ground; and
    a negative impedance compensator connected to said output terminal of said transimpedance amplifier element to increase said equivalent impedance with respect to the ground, and to compensate a parasitic capacitance at said output terminal;
    wherein said negative impedance compensator comprises a negative impedance element formed by a positive feedback circuit, and a compensation circuit for the parasitic capacitance at said output terminal.

2. The transimpedance amplifier having negative impedance compensation as claimed in claim 1, wherein said compensation circuit has a negative capacitance.

3. The transimpedance amplifier having negative impedance compensation as claimed in claim 1, wherein said negative impedance compensator is implemented by a negative resistor and a negative capacitor connected in parallel.

4. The transimpedance amplifier having negative impedance compensation as claimed in claim 1, wherein said transimpedance amplifier element comprises a photodiode and a basic operational amplifier.

5. The transimpedance amplifier having negative impedance compensation as claimed in claim 3, wherein said negative resistor is implemented by a transistor and an inverter.

6. The transimpedance amplifier having negative impedance compensation as claimed in claim 3, wherein said negative capacitor is implemented by a transistor, a current source, a capacitor and an inverter.

7. A transimpedance amplifier having negative impedance compensation comprising:
    a differential transimpedance amplifier having two single-stage transimpedance amplifiers, wherein said two single-stage transimpedance amplifiers are connected in parallel to form a differential circuit topology, and said differential transimpedance amplifier has two output terminals; and a negative impedance compensator connected to said two output terminals of said differential transimpedance amplifier to compensate parasitic capacitances at said two output terminals.

8. The transimpedance amplifier having negative impedance compensation as claimed in claim 7, wherein said negative impedance compensator is implemented by two symmetrical negative impedance compensators connected in parallel to form a differential circuit topology.

9. The transimpedance amplifier having negative impedance compensation as claimed in claim 7, wherein said differential transimpedance amplifier comprises a photodiode and two single-stage transimpedance amplifiers.

10. The transimpedance amplifier having negative impedance compensation as claimed in claim 8, wherein each of said symmetrical negative impedance compensators is implemented by a negative resistor and a negative capacitor connected in parallel.

11. The transimpedance amplifier having negative impedance compensation as claimed in claim 10, wherein said negative resistor is implemented by a transistor and an inverter.

12. The transimpedance amplifier having negative impedance compensation as claimed in claim 10, wherein said negative capacitor is implemented by a transistor, a current source, a capacitor and an inverter.

* * * * *